United States Patent [19]

Ishibashi et al.

[11] Patent Number: 5,617,446
[45] Date of Patent: Apr. 1, 1997

[54] SURFACE-EMITTING SEMICONDUCTOR LIGHT EMITTING DEVICE

[75] Inventors: Akira Ishibashi; Norikazu Nakayama; Satoru Kijima, all of Kanagawa, Japan

[73] Assignee: Sony Corporation, Tokyo, Japan

[21] Appl. No.: 499,894

[22] Filed: Jul. 11, 1995

[30] Foreign Application Priority Data

Jul. 11, 1994 [JP] Japan .................. 6-181779

[51] Int. Cl.$^6$ ........................... H01S 3/19
[52] U.S. Cl. ................ 372/96; 372/46; 372/45; 257/94; 257/98; 257/99
[58] Field of Search .................. 372/45, 96, 46; 257/94, 97, 98, 99, 103

[56] References Cited

U.S. PATENT DOCUMENTS

| | | | |
|---|---|---|---|
| 4,797,890 | 1/1989 | Inaba et al. | 372/45 |
| 5,351,255 | 9/1994 | Schetzina | 372/45 |
| 5,373,175 | 12/1994 | Ozawa et al. | 257/99 |
| 5,414,281 | 5/1995 | Watabe et al. | 257/97 |
| 5,471,067 | 11/1995 | Ikeda et al. | 257/94 |

FOREIGN PATENT DOCUMENTS

| | | |
|---|---|---|
| 632554 | 1/1995 | European Pat. Off. . |
| 4330756 | 3/1995 | Germany . |
| 2270199 | 3/1994 | United Kingdom . |
| WO94/15369 | 7/1994 | WIPO . |

*Primary Examiner*—Rodney B. Bovernick
*Assistant Examiner*—Yisun Song
*Attorney, Agent, or Firm*—Hill, Steadman & Simpson

[57] ABSTRACT

A surface-emitting semiconductor light emitting device comprises an n-type ZnSe buffer layer, n-type ZnSSe layer, n-type ZnMgSSe cladding layer, n-type ZnSSe waveguide layer, active layer, p-type ZnSSe waveguide layer, p-type ZnMgSSe cladding layer, p-type ZnSSe layer, p-type ZnSe contact layer, p-type ZnSe/ZnTe MQW layer and p-type ZnTe contact layer, sequentially stacked on an n-type GaAs substrate. A grid-shaped p-side electrode and a Au film convering the p-side electrode are provided on the p-type ZnTe contact layer. An n-side electrode is provided on the back surface of the n-type GaAs substrate. The active layer has a single quantum well structure or a multiple quantum structure including ZnCdSe quantum well layers.

11 Claims, 5 Drawing Sheets

SURFACE-EMITTING SEMICONDUCTOR LIGHT EMITTING DEVICE

BACKGROUND OF THE INVENTION

1. Field of the Invention

This invention relates to a surface-emitting semiconductor light emitting device and, more particularly, to a surface-emitting semiconductor light emitting device, such as semiconductor laser or light emitting diode, capable of surface emission of green to blue light.

2. Description of the Prior Art

Recently, demand has become greater and greater for semiconductor light emitting devices capable of emitting green to blue light, aiming higher recording and reproducing densities or higher resolutions of optical disks and magnet-optical disks, and efforts are devoted to developments of such devices.

U.S. Pat. No. 5,268,918 discloses a semiconductor light emitting device having cladding layers of ZnMgSSe which is one of II–VI compound semiconductors.

Itoh et al. report, in Electronics Letters Vol. 29 No. 9, pulse oscillation of a semiconductor laser of an SCH structure made of ZnCdSe/ZnSe/ZnMgSSe at room temperature.

Ren et al. report, in *J. Vac. Sci. Technol. B* 12(2), March/April 1994 pp 1262–1265, a LED having a double-heterostructure of ZnSe/ZnCdSe on a ZnSe substrate.

OBJECTS AND SUMMARY OF THE INVENTION

It is an object of the invention to provide a surface-emitting semiconductor light emitting device capable of surface emission of green to blue light, using II–VI compound semiconductors as materials of its cladding layers and active layer.

According to the invention, there is provided a surface-emitting semiconductor light emitting device, comprising: a first cladding layer on a substrate; an active layer on the first cladding layer; a second cladding layer on the active layer; a first electrode electrically connected to the first cladding layer; and a second electrode electrically connected to the second cladding layer, in which the first cladding layer, active layer and second cladding layer comprise II–VI compound semiconductors, and light is emitted in a direction normal to the plane of the active layer from one side of the active layer remoter from the substrate.

Since the device emits light in a direction normal to the plane of the active layer, such light emitting devices can be integrated more easily than light emitting devices configured to emit light in a direction normal to the cleavage plane.

When a ZnTe compound semiconductor layer is stacked on the second cladding layer and a grid electrode is provided on the ZnTe compound semiconductor layer, resistance of the ZnTe compound semiconductor layer can be greatly reduced by sufficiently increasing its carrier concentration by doping an impurity, and good ohmic contact between the ZnTe compound semiconductor layer and the grid-shaped electrode is ensured. This permits a reduction of the operating voltage of the surface-emitting semiconductor light emitting device and hence prevents heating at the contact of the grid electrode with the ZnTe compound semiconductor layer, which contributes to prevention of a decrease in efficiency of light emission or deterioration of the semiconductor light emitting device. When the thickness of the ZnTe compound semiconductor layer is in the range of 2 to 100 nm, the ZnTe compound semiconductor layer behaves as a transparent electrode, and does not disturb emission of light therethrough. When the ZnTe compound semiconductor layer is sufficiently thick, such as 50 nm or more, for example, the current injected through the grid electrode can be diffused in the direction parallel to the plane of the ZnTe compound semiconductor layer. It is thus possible to introduce the current into a wide area of the active layer and to realize excellently uniform surface emission of light.

When the grid electrode is made on the ZnTe compound semiconductor layer, the current injected into the ZnTe compound semiconductor layer through the grid electrode is more uniformly distributed than in a structure using a stripe-shaped electrode, for example. Therefore, uniformity of surface emission of light can be improved.

When a ZnSSe compound semiconductor layer is provided between the second cladding layer and the ZnTe compound semiconductor layer, also the ZnSSe compound semiconductor layer can be used as a cladding layer of a second conductivity type so as to ensure excellent optical confinement and carrier confinement characteristics. If the thickness of the ZnSSe compound semiconductor layer is around 0.5 μm, then the current introduced through the grid electrode can be diffused into a wide area in the direction parallel to the ZnSSe compound semiconductor layer, and hence ensures excellently uniform surface emission of light.

When a light reflecting layer is provided between the substrate and the first cladding layer, the light reflecting layer reflects a component of light generated in the active layer and running toward the substrate back to the grid electrode, and prevents that the light toward the substrate is absorbed by the substrate. Therefore, it is possible to use even the light toward the substrate for surface emission and hence improve the light emitting efficiency remarkably. Light is thus taken out efficiently from the light take-up portion.

With these arrangements, a semiconductor light emitting device capable of surface emission of green to blue light can be realized, using II–VI compound semiconductors as materials of its cladding layers and active layer.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
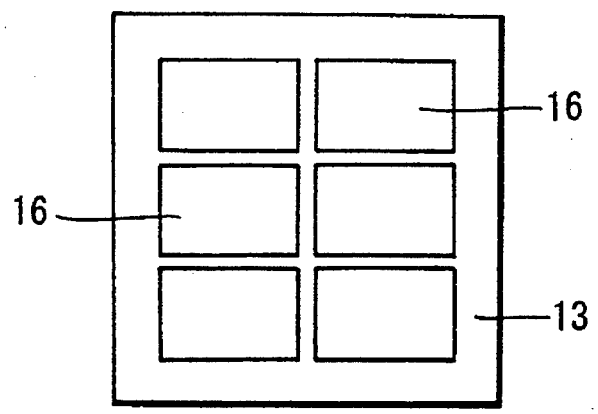
FIG. 1 is a plan view of a surface-emitting light emitting diode (LED) according to a first embodiment of the invention.

Some embodiments of the invention are explained below with reference to the drawings. In all drawings of embodiments, the same or equivalent elements are labelled with identical reference numerals.

Figure 2:
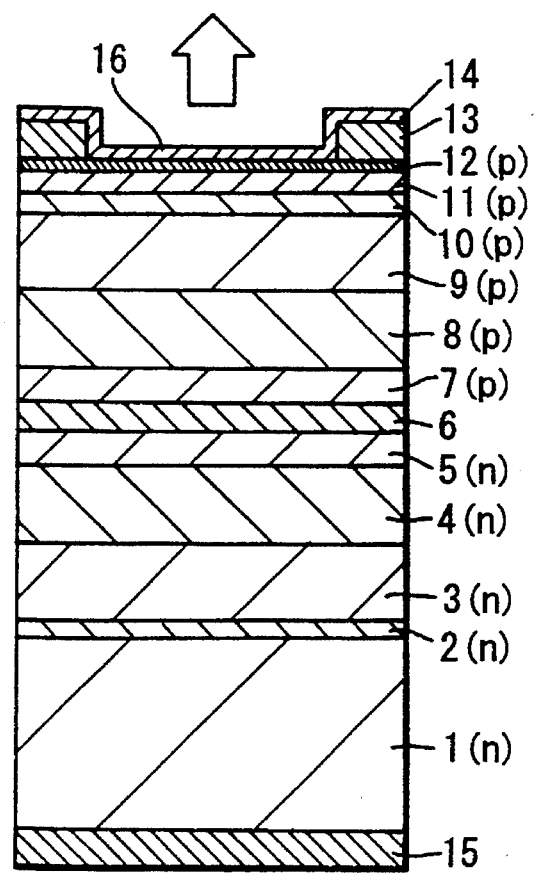
FIG. 2 is a cross-sectional view of the surface-emitting LED according to the first embodiment of the invention.

FIG. 1 is a plan view of a surface-emitting light emitting diode (LED) according to a first embodiment of the invention, and FIG. 2 is a cross-sectional view of a light emitting plane in the embodiment of FIG. 1 in an enlarged scale.

As shown in FIGS. 1 and 2, the surface-emitting LED according to the first embodiment is made by stacking on a (100)-oriented n-type GaAs substrate 1 doped with, for example, Si as a donor impurity, in sequence, an n-type ZnSe buffer layer 2 doped with, for example, Cl as a donor impurity; an n-type ZnSSe layer 3 doped with, for example, Cl as a donor impurity; an n-type ZnMgSSe cladding layer 4 doped with, for example, Cl as a donor impurity; an n-type ZnSSe waveguide layer 5 doped with, for example, Cl as a donor impurity; an active layer 6; a p-type ZnSSe waveguide layer 7 doped with, for example, N as an acceptor impurity; a p-type ZnMgSSe cladding layer 8 doped with, for example, N as an acceptor impurity; a p-type ZnSSe layer 9 doped with, for example, N as an acceptor impurity; a p-type ZnSe contact layer 10 doped with, for example, N as an acceptor impurity; a p-type. ZnSe/ZnTe multi-quantum-well layer (MQW) 11 comprising alternately stacked p-type ZnSe barrier layers and p-type ZnTe quantum well layer; and a p-type ZnTe contact layer 12 doped with, for example, N as an acceptor impurity. A grid-shaped p-side electrode 13 is formed on the p-type ZnTe contact layer 12, and a Au film 14 is provided on the entire surface, covering the p-side electrode 13. Formed on the back surface of the n-type GaAs substrate 1 is an n-side electrode 15. The p-type ZnSe/ZnTe MQW layer 11 will be explained later in greater detail.

In the first embodiment, the active layer 6 has a single-quantum-well structure or a multi-quantum-well structure including one or more quantum well layers made of ZnCdSe (for example, $Zn_{0.85}Cd_{0.15}Se$) of a total thickness of 6 to 12 nm.

Used as the n-type ZnSSe layer 3 and the p-type ZnSSe layer 9 are, for example, $ZnS_{0.06}Se_{0.94}$ layers. Similarly, the n-type ZnSSe waveguide layer 5 and the p-type ZnSSe waveguide layer 7 are, for example, $ZnS_{0.06}Se_{0.94}$. The n-type ZnMgSSe cladding layer 4 and the p-type ZnMgSSe cladding layer 8 are, for example, $Zn_{0.91}Mg_{0.09}S_{0.18}Se_{0.82}$ layers. The n-type ZnMgSSe cladding layer 4 and the p-type ZnMgSSe cladding layer 8 with the composition of $Zn_{0.91}Mg_{0.09}S_{0.18}Se_{0.82}$ are in lattice matching with GaAs, and the n-type ZnSSe layer 3, p-type ZnSSe layer 9, n-type ZnSSe waveguide layer 5 and p-type ZnSSe waveguide layer 7 having the composition of $ZnS_{0.06}Se_{0.94}$ are in lattice matching with the n-type ZnMgSSe cladding layer 4 and the p-type ZnMgSSe cladding layer 8 having the above composition.

The n-type ZnSSe layer 3 is 0.7 μm thick, for example, and its effective donor concentration $N_D-N_A$ ($N_D$ is the donor concentration and $N_A$ is the acceptor concentration) is $(2\sim5)\times10^{17}$ cm$^{-3}$, for example. The n-type ZnMgSSe cladding layer 4 is 0.7 μm thick, for example, and its $N_D-N_A$ is $(2\sim5)\times10^{17}$ cm$^{-3}$, for example. The n-type ZnSSe waveguide layer 5 is 100 nm thick, for example, and its $N_D-N_A$ is $(2\sim5)\times10^{17}$ cm$^{-3}$ for example The p-type ZnSSe waveguide layer 7 is 100 nm thick, for example, and its effective acceptor concentration $N_A-N_D$ is $(2\sim5)\times10^{17}$ cm$^{-3}$, for example. The p-type ZnMgSSe cladding layer 8 is 0.5 μm thick, for example, and its $N_A-N_D$ is $1\times10^{17}$ cm$^{-3}$, for example. The p-type ZnSSe layer 9 is 0.5 μm thick, for example, and its $N_A-N_D$ is $(2\sim5)\times10^{17}$ cm$^{-3}$, for example. The p-type ZnSe contact layer 10 is 100 nm thick, for example, and its $N_A-N_D$ is $(5\sim8)\times10^{17}$ cm$^{-3}$, for example. The p-type ZnTe contact layer 12 is 2~100 nm thick, for example, and its $N_A-N_D$ is $1\times10^{19}$ cm$^{-3}$, for example.

The thickness of the n-type ZnSe buffer layer 2 is determined sufficiently smaller than the critical thickness of ZnSe (~100 nm) in order to prevent generation of dislocation during epitaxial growth of the n-type ZnSe buffer layer 2 and other overlying layers, which may occur due to a lattice mismatching, although slight, between ZnSe and GaAs. In the first embodiment, the thickness of the n-type ZnSe buffer layer 2 is 33 nm, for example.

Used as the p-side electrode 13 is a Au electrode, Pd/Pt/Au electrode, or the like. The n-side electrode 15 is an In electrode, for example.

The surface-emitting LED according to the first embodiment has a square geometry of 1 mm×1 mm, for example, in its plan view.

In the first embodiment, the p-type ZnSSe layer 9 has various functions, such as the behavior as an additional second p-type cladding layer other than the p-type ZnMgSSe cladding layer 8; diffusing a current introduced from the p-side electrode 13 and the Au film 14 in the direction parallel to plane of the p-type ZnSSe layer 9; establishing lattice-matching with the p-type ZnMgSSe cladding layer 8; and behaving as a spacer for preventing short-circuit which might occur when solder creeps up along end surfaces of diode chips upon mounting such chips on a heat sink.

The p-type ZnSSe layer 9 behaving as a second p-type cladding layer, together with the p-type ZnMgSSe cladding layer 8, can improve optical confinement characteristics and carrier confinement characteristics. Since the mobility of holes in ZnSSe is larger than that in ZnMgSSe, the resistance of the p-type cladding layer is lower in the structure where both the p-type ZnMgSSe cladding layer 8 and the p-type ZnSSe layer 9 form the p-type cladding layer of a given total thickness than in the structure where only the p-type ZnMgSSe 8 forms the p-type cladding layer of the same total thickness. Lower resistance of the p-type cladding layer decreases the voltage drop of the p-type cladding layer, and contributes to a reduction of the operating voltage of the surface-emitting LED.

The function of diffusing a current introduced from the p-side electrode 13 and the Au film 14 in the direction parallel with the plane of the p-type ZnSSe layer 9 makes the current be injected to a wider area of the active layer 6, and ensures uniform surface emission of light.

If the p-type ZnSe contact layer 10 is stacked directly on the p-type ZnMgSSe cladding layer 8, a lattice mismatching between them would cause their crystalline deterioration. However, since the p-type ZnSSe layer 9 in lattice matching with the p-type ZnMgSSe cladding layer 8 is stacked thereon, and the p-type ZnSe contact layer 10 is stacked on the p-type ZnSSe layer 9, the p-type ZnSSe layer 9 and p-type ZnSe contact layer 10 are maintained in a good crystalline condition. This contributes to an improvement in ohmic contact of the p-side electrode 13 with the Au film 14.

In addition to these advantages, the use of the p-type ZnSSe layer 9 has the following merit. That is, the use of the p-type ZnSSe layer 9 as the second p-type cladding layer permits a minimal thickness of the p-type ZnMgSSe cladding layer 8 whose epitaxial growth is not so easy as that of binary or tertiary II–VI compound semiconductors, and hence makes fabrication of surface-emitting LEDs so much easier.

The n-type ZnSSe layer 3 has some functions, such as symmetrizing refractive indices at both sides of the active layer 6; behaving as a second n-type cladding layer additional to the n-type ZnMgSSe cladding layer 4; lattice-matching with the n-type ZnMgSSe cladding layer 4; and behaving as a spacer for preventing short-circuit which might occur when solder creeps up along end surfaces of diode chips upon mounting such chips on a heat sink.

Since the p-type ZnTe contact layer 12 is as thin as 2~100 nm and exhibits a significantly high $N_A$-$N_D$ as high as $1 \times 10^{19}$ cm$^{-3}$, it works as a transparent electrode with a low resistance. This results in a good ohmic contact with the p-side electrode 13 and the Au film 14 formed on the p-type ZnTe contact layer 12, while ensuring emission of light with no disturbance even with the p-type ZnTe contact layer 12 covering the entire surface. When the thickness of the p-type ZnTe contact layer 12 is around 50 nm, a current introduced through the p-side electrode 13 and the Au film 14 can diffuse widely in the direction parallel with the plane of the p-type ZnTe contact layer 12, which contributes to realization of excellently uniform surface emission of light.

If the p-type ZnSe contact layer 10 were in direct contact with the p-type ZnTe contact layer 12, large discontinuity would be produced in valence bands near their interface and would behave as a barrier layer against holes injected from the p-side electrode 13 and the Au film 14 into the p-type ZnTe contact layer 12. The use of the p-type ZnSe/ZnTe MQW layer 11 is for the purpose of effectively removing the barrier.

More specifically, although the carrier concentration in p-type ZnSe is typically on the order of $5 \times 10^{17}$ cm$^{-3}$, the carrier concentration in p-type ZnTe can be $10^{19}$ cm$^{-3}$ or more. In addition, the magnitude of the discontinuity in valence bands at the interface between p-type ZnSe and p-type ZnTe is about 0.5 eV. At the junction between p-type ZnSe and p-type ZnTe, if it is a step junction, the valence band of p-type ZnSe bends over the width $$W = (2\epsilon \phi_T / q N_A)^{1/2} \quad (1)$$

where $\epsilon$ is the dielectric constant of ZnSe, and $\phi_T$ is the dimension of the discontinuity in valence bands at the p-type ZnSe/p-type ZnTe interface (about 0.5 eV).

Figure 3:
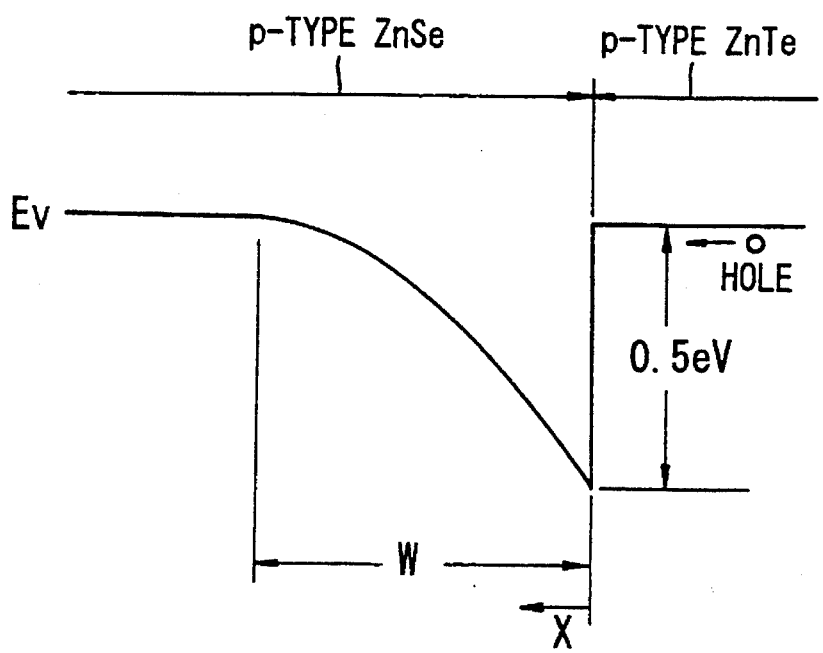
FIG. 3 is an energy band diagram showing valence bands of p-type ZnSe and p-type ZnTe near their interface.

Calculation of W using Equation (1) results in W=32 nm. FIG. 3 shows how the top of a valence band changes in the direction normal to the interface between p-type ZnSe and p-type ZnTe interface. Note that Fermi levels of p-type ZnSe and p-type ZnTe are similar when coinciding with tops of their valence bands. In this case, the valence band of p-type ZnSe bends downwardly (toward lower energies) toward p-side ZnTe as shown in FIG. 3. This change in valence band having a downwardly pointed representation behaves as a potential barrier against holes injected into the p-side ZnSe/p-side ZnTe junction.

This problem can be solved by providing the p-type ZnSe/ZnTe MQW layer 11 between the p-type ZnSe contact layer 10 and the p-type ZnTe contact layer 12. A specific design of the p-type ZnSe/ZnTe MQW layer 11 is explained below.

Figure 4:
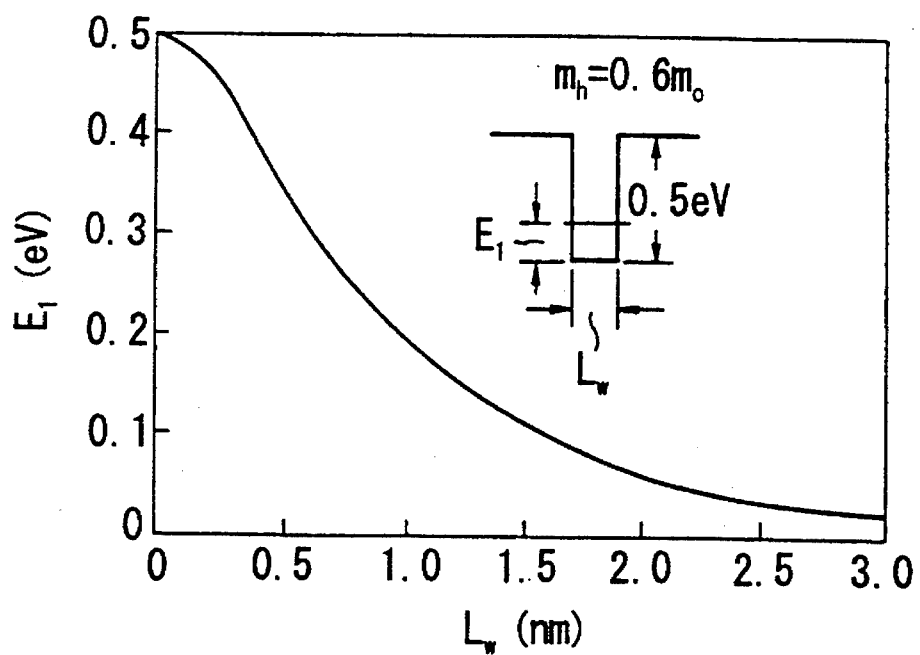
FIG. 4 is a graph showing changes in first quantum level $E_1$ with width $L_w$ of a quantum well comprising p-type ZnTe.

FIG. 4 shows a result of quantum-mechanical calculation of a well-type potential of a finite barrier to know how the first quantum level $E_1$ changes with the width $L_w$ of the quantum well of p-type ZnTe in a single-quantum-well structure in which the p-type ZnTe quantum well layer is sandwiched by p-type ZnSe barrier layers from opposite sides. The calculation uses 0.6 $m_0$ ($m_0$: stationary mass of an electron in vacuum) as the mass of an electron in the quantum well layer and the barrier layer, letting it be equal to the effective mass $m_h$ of a hole in p-type ZnSe and p-type ZnTe, and assumes the depth of the well being 0.5 eV.

It is known from FIG. 4 that, by decreasing the width $L_w$ of the quantum well, the first quantum level $E_1$ formed in the quantum well can be elevated. The p-type ZnSe/ZnTe MQW layer 11 is designed, using this theory.

In this case, the bend in the band of p-type ZnSe over the width W from the interface between p-type ZnSe and p-type ZnTe is given by the following quadratic function of the distance x (FIG. 3) from the interface $$\phi(x) = \phi_T \{1 - (x/W)^2\} \quad (2)$$

Therefore, the p-type ZnSe/ZnTe MQW layer 11 can be designed, based on Equation (2), by stepwise changing $L_w$ such that first quantum levels $E_1$ formed in respective p-type ZnSe quantum well layers coincide with top energies of valence bands of p-type ZnSe and p-type ZnTe, and are equal to each other.

Figure 5:
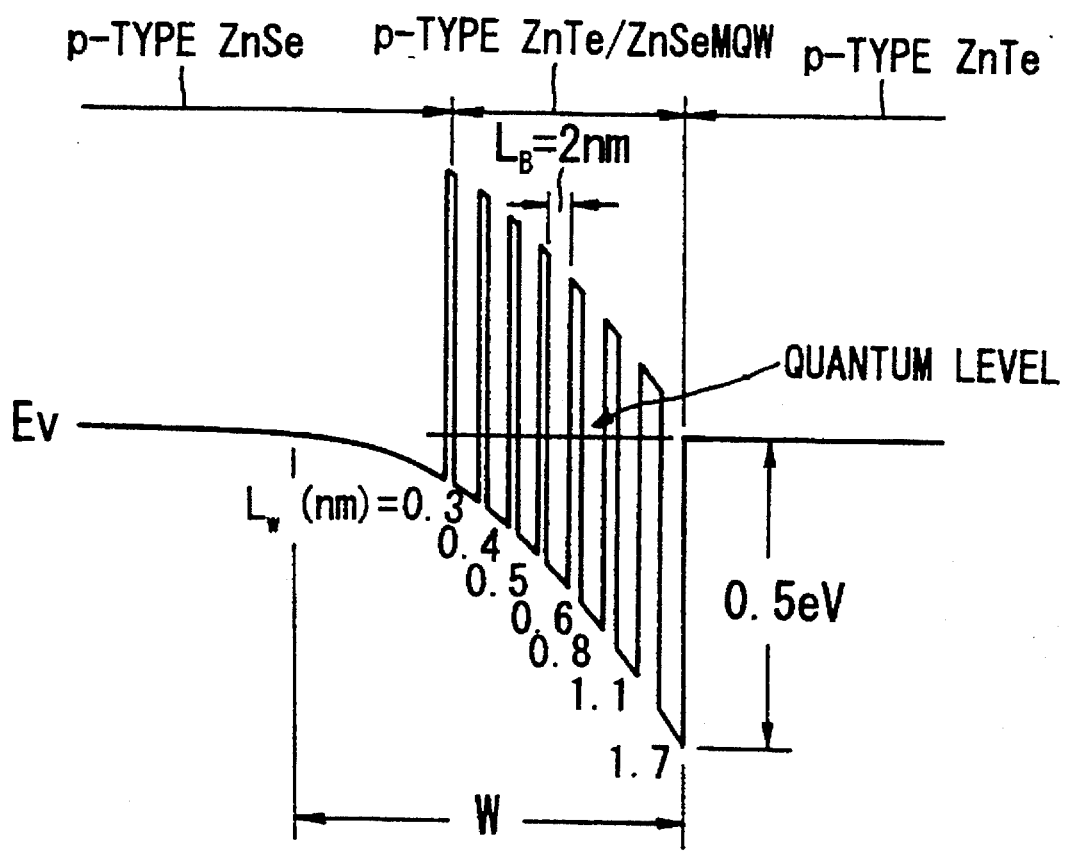
FIG. 5 is an energy band diagram showing a design of a p-type ZnSe/ZnTe MQW layer in the surface-emitting LED according to the first embodiment of the invention.

FIG. 5 shows a design of the widths $L_w$ of quantum wells of the p-type ZnSe/ZnTe MQW layer 11 when the width of its each p-type ZnSe barrier layer is 2 nm. In this case, $N_A$-$N_D$ of the p-type ZnSe contact layer 10 is $5 \times 10^{17}$ cm$^{-3}$, and $N_A$-$N_D$ of the p-type ZnTe contact layer 12 is $1 \times 10^{19}$ cm$^{-3}$. As shown in FIG. 5, widths $L_w$ of seven quantum wells, in total, are made to vary such that their first quantum levels $E_1$ coincide with Fermi levels of p-type ZnSe and p-type ZnTe, that is, to vary from the p-type ZnSe contact layer 10 toward the p-type ZnTe contact layer 12 as $L_w$=0.3 nm, 0.4 nm, 0.5 nm, 0.6 nm, 0.8 nm, 1.1 nm, and 1.7 nm.

Upon designing Widths $L_w$ of quantum wells, in a strict sense, interactions among the quantum wells must be considered because their levels couple with each other, and effects of any possible distortion due to lattice mismatching between quantum wells and barrier layers must be incorporated as well. Theoretically, however, it is sufficiently possible to make the quantum levels of the multi-quantum-wells flat as shown in FIG. 5.

In FIG. 5, since holes injected into p-type ZnTe can flow to p-type ZnSe by resonant tunneling through first quantum levels $E_1$ formed in respective quantum wells in the p-type ZnSe/ZnTe MQW layer 11, substantially no potential barrier is produced at the interface between p-type ZnSe and p-type ZnTe. Therefore, the surface-emitting LED according to the first embodiment of the invention exhibits good voltage-to-current characteristics and is operative with a lower voltage.

To operate the surface-emitting LED according to the first embodiment having the above construction, a current is injected by applying a necessary voltage between the p-side electrode 13 as well as the Au film 14 and the n-side electrode 15. In this case, due to the p-side electrode 13 and the Au film 14 being in contact with the entire surface of the p-type ZnTe contact layer 12, the current is uniformly injected to the entire area of the p-type ZnTe contact layer 12 from the p-side electrode 13 and the Au film 14. Moreover, while passing the p-type ZnTe contact layer 12 and the p-type ZnSSe layer 9, the current is sufficiently distributed in directions parallel to the planes of these layers. Therefore, the current is injected to the entirety of the active layer 6 with a uniform distribution, which results in uniform emission of light by electron-hole recombination in the entirety of the active layer 6. Thus, as shown by the arrow in FIG. 2, light with an extensive diameter is taken out from the light emitting surface 16 proximal to the p-side electrode 13, and remarkably uniform surface emission of light is realized.

The surface-emitting LED according to the first embodiment was operated for a test with the injected current of 200 mA at room temperature, and surface emission of bluish green light with the wavelength of 512 nm was observed. The luminous intensity of the light was remarkably high, as high as 4 cd. The light output was 1.14 mW, and the external quantum efficiency was 2.35%. The width at half maximum of the peak of emission with the wavelength of 512 nm was 10 nm.

Explained below is a method for fabricating the surface-emitting LED according to the first embodiment having the above-explained construction.

To fabricate the surface-emitting LED according to the first embodiment, first epitaxially grown on the n-type GaAs substrate 1 by molecular beam epitaxy (MBE), for example, at a temperature in the range of e.g. 250° to 300° C., specifically at 295° C., for example, are in sequence: the n-type ZnSe buffer layer 2, n-type ZnSSe layer 3, n-type ZnMgSSe cladding layer 4, n-type ZnSSe waveguide layer 5, active layer 6 including ZnCdSe quantum well layers, p-type ZnSSe waveguide layer 7, p-type ZnMgSSe cladding layer 8, p-type ZnSSe layer 9, p-type ZnSe contact layer 10, p-type ZnMgSSe cladding layer 8, p-type ZnSe/ZnTe MQW layer 11, and p-type ZnTe contact layer 12. This process ensures epitaxial growth of these layers with good crystalline structures, hence diminishes deterioration of the surface-emitting LED such as a decrease in light output, and ensures a high reliability of the device.

Used for the epitaxial growth using MBE are Zn with the purity of 99.9999% as the material of Zn, Mg with the purity of 99.9% or more as the material of Mg, ZnS with the purity of 99.9999% as the material of S, and Se with the purity of 99.9999% as the material of Se. Doping of Cl as a donor impurity of the n-type ZnSe buffer layer 2, n-type ZnSSe layer 3, n-type ZnMgSSe cladding layer 4 and n-type ZnSSe waveguide layer 5 is done, using $ZnCl_2$ with the purity of 99.9999%, for example, as the dopant. On the other hand, doping of N as an acceptor impurity of the p-type ZnSSe waveguide layer 7, p-type ZnMgSSe cladding layer 8, p-type ZnSSe layer 9, p-type ZnSe contact layer 10, p-type ZnSe/ZnTe MQW layer 11 and p-type ZnTe contact layer 12 is done by irradiating $N_2$ plasma generated by electron-cyclotron resonance (ECR), for example.

After that, a resist pattern (not shown) with a geometry corresponding to the reverse pattern of the p-side electrode 13 is formed on the p-type ZnTe contact layer 12 by lithography, followed by deposition of a metal film for making the p-side electrode on the entire surface of the structure by, for example, sputtering or vacuum evaporation. Then the resist pattern is removed together with overlying portions of the metal film (lift-off). Thus the grid-shaped p-side electrode 13 is formed on the p-type ZnTe contact layer 12. After that, annealing is done, if necessary, to bring the p-side electrode 13 and the Au film 14 into ohmic contact with the p-side ZnTe contact layer 12. Formed on the back surface of the n-type GaAs substrate 1 is the n-side electrode 15, such as In electrode.

After that, the n-type GaAs substrate 1 supporting the diode structure thereon is cleaved into cubes of the size of 1 mm×1 mm to complete expected surface-emitting LEDs.

Epitaxial growth of respective layers of the surface-emitting LED according to the first embodiment may use metallorganic chemical vapor deposition in lieu of MBE.

As described above, the first embodiment can realize a surface-emitting LED capable of surface emission of bluish green light with a high luminance and a high performance by using II–VI compound semiconductors.

Figure 6:
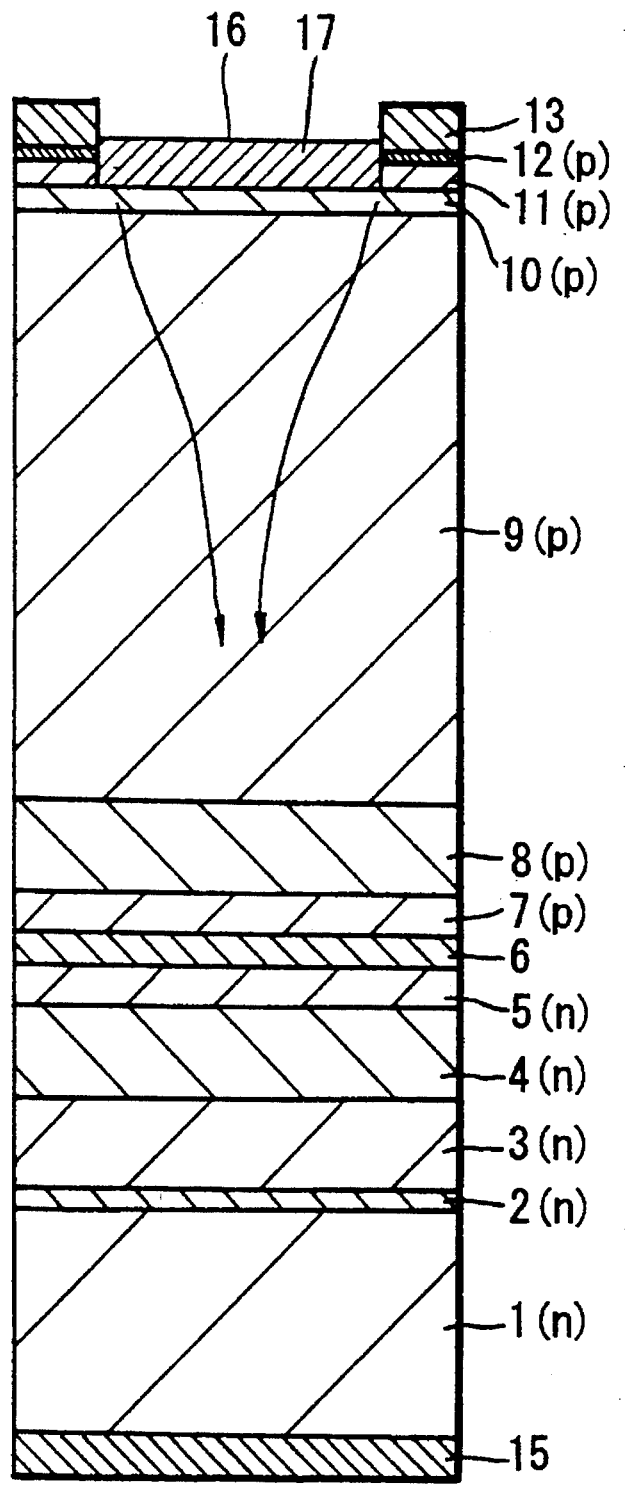
FIG. 6 is a cross-sectional view of a surface-emitting LED according to a second embodiment of the invention.

FIG. 6 shows a surface-emitting LED according to a second embodiment of the invention. Plan view of this surface-emitting LED appears identical to FIG. 1.

As shown in FIG. 6, the surface-emitting LED according to the second embodiment has the same construction as that of the surface-emitting LED according to the first embodiment, except for its p-type ZnSSe layer 9 being as thick as several times μm; selective portions of the p-type ZnSe/ZnTe MQW layer 11 and the p-side ZnTe contact layer 12 other than those lying under the p-side electrode 13 being partly removed to expose the underlying p-type ZnSe contact layer 10 on which an anti reflection film 17 of e.g. SiN is formed; and no Au film 14 being used.

The surface-emitting LED according to the second embodiment can be fabricated by substantially the same method as that according to the first embodiment, which is omitted from the explanation made below.

Since the surface-emitting LED according to the second embodiment uses no Au film 14, electric current is introduced only through the p-side electrode 13, which results in less uniform distribution of the current near the p-side electrode 13 than that of the surface-emitting LED according to the first embodiment. However, since the current can diffuse wider and wider in the directions parallel to the plane of the p-side ZnSSe layer 9 while passing through the layer 9 which is as thick as several times μm, the current can extend even to the central portion of the active layer 6 which is offset from the p-side electrode 13. In FIG. 6, this aspect is schematically shown by paths of holes. In this fashion, excellently uniform surface emission of light can be realized even though the current is injected only through the grid-shaped p-side electrode 13.

Also the second embodiment, as well as the first embodiment, can realize a surface-emitting LED capable of surface emission of bluish green light with a remarkably high luminance and a high performance by using II–VI compound semiconductors.

Figure 7:
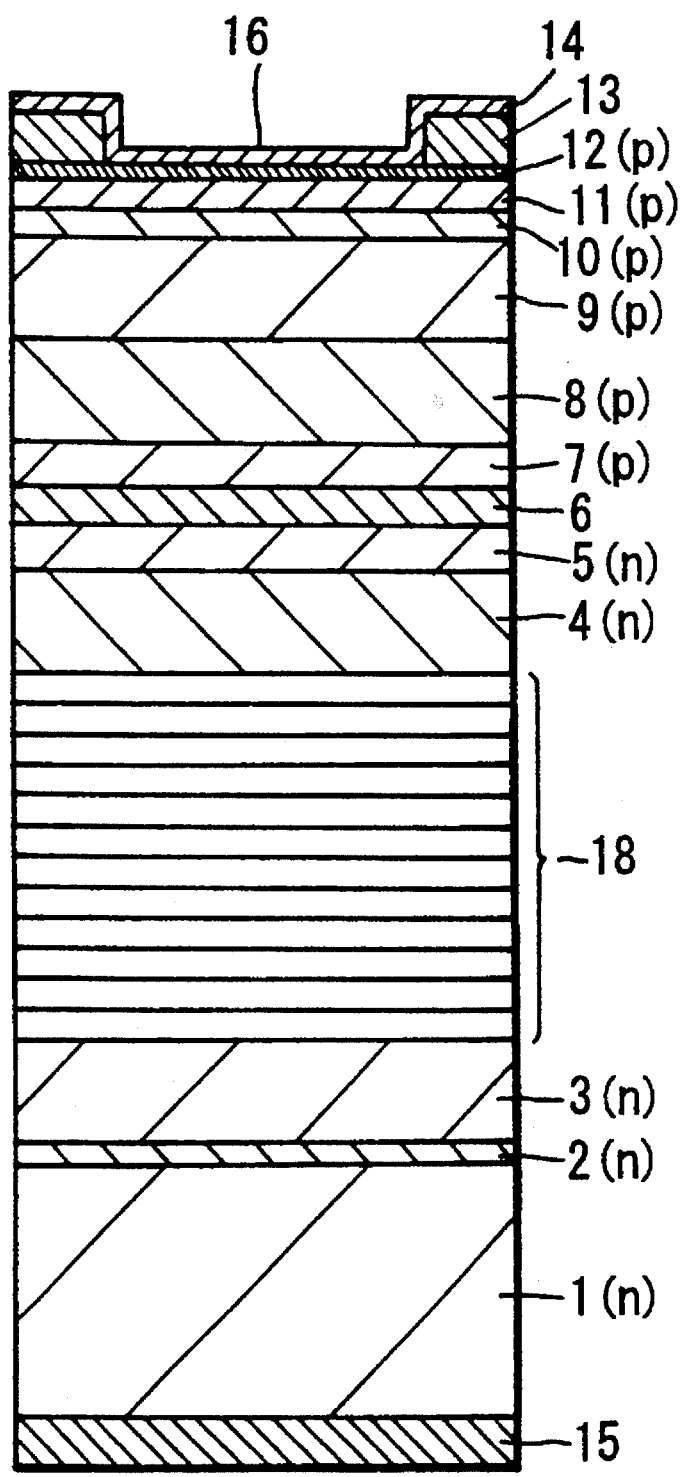
FIG. 7 is a cross-sectional view showing a surface-emitting LED according to a third embodiment of the invention.

FIG. 7 shows a surface-emitting LED according to a third embodiment of the invention. Plan view of this surface-emitting LED appears identical to FIG. 1.

As shown in FIG. 7, the surface-emitting LED according to the third embodiment includes a Bragg reflector 18 comprising a ZnMgSSe/ZnSSe superlattice layer provided between the n-type ZnSSe layer 3 and the n-type ZnMgSSe cladding layer 4. To maximize the reflectivity of the Bragg reflector 18, the thickness of each layer of the ZnMgSSe/ZnSSe superlattice layer forming the Bragg reflector 18 is determined such that the optical distance obtained by multiplying the thickness by the refractive index be ¼ of the wavelength of emission. To further increase the reflectivity of the Bragg reflector 18, it is recommended to increase the period of repetition of the ZnMgSSe/ZnSSe superlattice layer forming the Bragg reflector 18. In the other respects, the surface-emitting surface-emitting LED according to the third embodiment is the same as the arrangement of the surface-emitting LED according to the first embodiment.

The surface-emitting LED according to the third embodiment can be fabricated by substantially the same method as that according to the first embodiment, which is omitted from the explanation made below.

According to the surface-emitting LED according to the third embodiment, since a component of light generated in the active layer 6 and running toward the n-type GaAs substrate 1 is reflected by the Bragg reflector 18 toward the p-side electrode 13, it is prevented that the light toward the n-type GaAs substrate 1 is absorbed by the n-type GaAs substrate 1, and even the light toward the n-type GaAs substrate can be utilized for surface emission. As a result, emission efficiency can be approximately doubled as compared with a structure using no Bragg reflector 18.

The third embodiment also realizes a surface-emitting LED capable of surface emission of bluish green light with a higher luminance than those of the first and second embodiments.

In a device using the Bragg reflector 18, a disturbance may occur for a reduction of the operating voltage due to a voltage drop caused by the Bragg reflector 18. However, by taking an appropriate transaction, such as inclining the composition ratio at the heterointerface of the ZnMgSSe/ZnSSe superlattice layer forming the Bragg reflector 18, doping a high concentration of impurity into the MgSSe/ZnSSe superlattice layer, or executing so-called delta doping to form a microcapacitor, voltage drop caused by the Bragg reflector 18 during actual operation of the surface-emitting LED can be decreased. Then the surface-emitting LED can be protected from deterioration and be operative for a longer life.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, a surface-emitting semiconductor laser can be realized with the same structure as that of the surface-emitting LED according to the third embodiment. That is, the Bragg reflector 18 and vacuum on the side of the p-side electrode 13 make a vertical cavity structure capable of laser oscillation.

The n-type ZnSSe waveguide layer 5 and the p-type ZnSSe waveguide layer 7 used in the first to third embodiments may be replaced by an n-type ZnSe waveguide layer and a p-type ZnSe waveguide layer. Alternatively usable as the substrate is, foe example, a GaAs substrate, ZnSe substrate, GaP substrate, or the like.

Although the first to third embodiments employ irradiation of $N_2$ plasma generated by ECR for doping N as an acceptor impurity into the p-type ZnSe waveguide layer 7, p-type ZnMgSSe cladding layer 8, p-type ZnSSe layer 9, p-type ZnSe contact layer 10, p-type ZnSe/ZnTe MQW layer 11 and p-type ZnTe contact layer 16, doping of N may be done by irradiating $N_2$ excited by high frequency plasma, for example.

Since the surface-emitting semiconductor light emitting device according to the invention can emit green to blue light with a high luminance, by combining this device with an existing semiconductor light emitting devices for emitting red light with a high luminance, three primary colors can be made. Thus a color display or other like system can be realized.

As described above, the invention can realize a surface-emitting semiconductor light emitting device capable of surface emission of green to blue light, using II–VI compound semiconductors as materials of its cladding layers and active layer.

What is claimed is:

1. A surface-emitting semiconductor light emitting device, comprising:
    a first cladding layer on a substrate;
    an active layer on said first cladding layer;
    a second cladding layer on said active layer;
    a first electrode electrically connected to said first cladding layer;
    a second electrode electrically connected to said second cladding layer, said second electrode being provided in a region other than a light emitting region, and
    a thin film electrode of gold thin enough for light to pass therethrough provided in said light emitting region,
    said first cladding layer, said active layer and said second cladding layer comprising II–VI compound semiconductors, and light being emitted in a direction normal to the plane of said active layer from one side of the active layer remoter from said substrate.

2. The surface-emitting semiconductor light emitting device according to claim 1 wherein said first cladding layer and said second cladding layer comprise ZnMgSSe.

3. The surface-emitting semiconductor light emitting device according to claim 1 wherein a ZnSSe current-diffusing layer is provided between said second cladding layer and said second electrode.

4. The surface-emitting semiconductor light emitting device according to claim 3 wherein said current-diffusing layer has a thickness in the range of 0.1–10 µm.

5. The surface-emitting semiconductor light emitting device according to claim 1 wherein said second electrode is a grid electrode.

6. The surface-emitting semiconductor light emitting device according to claim 1 wherein an anti reflection film is provided in said light emitting region.

7. The surface-emitting semiconductor light emitting device according to claim 1 wherein a Bragg reflector is provided between said substrate and said first cladding layer.

8. The surface-emitting semiconductor light emitting device according to claim 7 wherein said Bragg reflector comprises a ZnMgSSe/ZnSSe superlattice layer.

9. The surface-emitting semiconductor light emitting device according to claim 1 wherein a ZnTe contact layer thin enough for light to pass therethrough is provided between said second cladding layer and said second electrode.

10. The surface-emitting semiconductor light emitting device according to claim 9 wherein the thickness of said ZnTe contact layer is in the range of 2–100 nm.

11. A surface-emitting semiconductor light emitting device, comprising:
    an n-type ZnMgSSe layer on an n-type GaAs substrate;
    a ZnCdSe active layer on said n-type ZnMgSSe layer;
    a p-type ZnMgSSe layer on said active layer;
    a p-type ZnSSe current-diffusing layer on said p-type ZnMgSSe layer;
    a first electrode electrically connected to said substrate; and
    a second electrode electrically connected to said current-diffusing layer,
    said device emitting light in a direction normal to the surface of said active layer from one side of said active layer remoter from said substrate, said second electrode being provided in a region excluding a light emitting region, and a thin-film electrode of gold thin enough for light to pass therethrough being provided in said light emitting region.

* * * * *